(12) United States Patent
Tang

(10) Patent No.: US 6,498,530 B1
(45) Date of Patent: Dec. 24, 2002

(54) AUTO-ZEROED PING-PONG AMPLIFIER WITH LOW TRANSIENT SWITCHING

(75) Inventor: Andrew T. K. Tang, Santa Clara, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/946,709

(22) Filed: Sep. 4, 2001

(51) Int. Cl.[7] .............................. H03F 1/02; H03K 17/00
(52) U.S. Cl. .............................. 330/9; 330/51; 327/124
(58) Field of Search ................................ 330/9, 51, 69, 330/258; 327/124, 307

(56) References Cited

U.S. PATENT DOCUMENTS

| 4,931,745 | A | | 6/1990 | Goff et al. | 330/9 |
| 5,115,202 | A | | 5/1992 | Brown | 330/9 |
| 5,847,600 | A | * | 12/1998 | Brooks et al. | 330/9 |
| 6,121,831 | A | * | 9/2000 | Mack | 330/9 |
| 6,140,872 | A | * | 10/2000 | McEldowney | 330/9 |
| 6,407,630 | B1 | * | 6/2002 | Yao et al. | 330/51 |

OTHER PUBLICATIONS

IEEE Journal of Solid–State Circuits, *A Rail–to–Rail Ping–Pong OP–AMP,* Ion E. Opris and Gregory T.A. Kovacs, vol. 31, No. 9, Sep. 1996, pp. 1320–1324.

* cited by examiner

*Primary Examiner*—Robert Pascal
*Assistant Examiner*—Khanh Van Nguyen
(74) *Attorney, Agent, or Firm*—Koppel, Jacobs, Patrick & Heybl

(57) ABSTRACT

A ping-pong amplifier includes two differential amplifiers A1 and A2 and an error amplifier. The error amplifier has one input connected to a predetermined common-mode reference voltage VCMR, its other input switchably connected to the common-mode outputs of A1 or A2, and an output which is switchably connected to the common-mode reference (CMR) voltage inputs of A1 and A2. Respective memory capacitors CM1 and CM2 are connected to the two CMR inputs. The error amplifier is periodically connected between A1's common-mode output and its CMR input to form a closed-loop which forces A1's common-mode output voltage to be equal to VCMR, with the error amplifier's output voltage stored on CM1. A2's common-mode output voltage is similarly calibrated, with the error amplifier's output voltage stored on CM2. Both common-mode output voltages are thus made equal to VCMR, thereby reducing transients that might otherwise appear in the output as the amplifier ping-pongs between A1 and A2.

22 Claims, 5 Drawing Sheets

AUTO-ZEROED PING-PONG AMPLIFIER WITH LOW TRANSIENT SWITCHING

BACKGROUND OF THE INVENTION

1. Field of the Invention

This invention relates to the field of ping-pong amplifiers, and particularly to techniques for reducing transient switching errors for such amplifiers.

2. Description of the Related Art

Auto-zeroed ping-pong amplifiers are known to provide low input offset voltages. A schematic diagram of a basic ping-pong amplifier 10 is shown in FIG. 1a. Two amplifiers A1 and A2, each of which has differential inputs and outputs, receive a differential input signal made up of signals INP and INM. Each amplifier also includes a common-mode reference voltage input CMR connected to receive a common-mode reference voltage VCMR, and a common-mode feedback circuit. The common-mode feedback circuit sets the amplifier's common-mode output voltage—given by the sum of its differential outputs divided by 2—so that each of its outputs is nominally set to VCMR when the differential output voltage is zero. VCMR is typically set to a value between the amplifier's power rails so that the amplifier may have a high gain.

The ping-pong amplifier also includes an output amplifier A0, which is connectable to the outputs of A1 via a pair of switches S1 and S2, or to the outputs of A2 via a pair of switches S3 and S4. A0 has a compensation capacitor CC connected from its output to its inverting input, and provides the ping-pong amplifier's single-ended output OUT. A pair of fully differential nulling amplifier's A3 and A4 are used to auto-zero A1 and A2, respectively; the inputs of A3 and A4 are connected to the outputs of A1 and A2 via pairs of switches S5/S6 and S7/S8, respectively. A pair of memory capacitors C1 and C2 are connected to the inputs of A3, and memory capacitors C3 and C4 are connected to A4's inputs. A switch S9 is connected between the inputs of A1, and a switch S10 is connected between the inputs of A2. A switch S11 is connected between INM and A1, and a switch S12 is connected between INM and A2.

The switches are controlled with a control circuit (not shown), which operates them in accordance with the timing diagram shown in FIG. 1a. The ping-pong amplifier has a two-phase timing cycle. During the first phase ($\phi 1$), switches S5, S6 and S9 are closed, such that amplifier A1 is auto-zeroed by the output currents of nulling amplifier A3, with the error signals stored on memory capacitors C1 and C2. Switches S3, S4 and S12 are also closed during $\phi 1$, allowing the differential input signal to be amplified by A2 followed by A0. The roles are reversed during the second phase ($\phi 2$): switches S7, S8 and S10 are closed such that A2 is auto-zeroed by A4 (with the error signals stored on memory capacitors C3 and C4), and switches S1, S2 and S11 are closed such that the input signal is amplified by A1 followed by A0.

As noted above, amplifiers A1 and A2 each include common-mode feedback circuits which nominally set their common-mode output voltages to VCMR when their differential output voltages are zero. One weakness in this arrangement is that mismatch in the common-mode feedback circuit can result in common-mode output voltages which differ from VCMR. For example, A1 and A2 may produce common-mode output voltages VCMR1 and VCMR2, respectively, and due to mismatch, VCMR1≠VCMR2.

A possible cause for this type of mismatch is illustrated in FIG. 1b, which shows one possible implementation of a fully differential amplifier such as A1 or A2: transistors M1–M4 and current sources I0–I2 form an operational amplifier, and transistors M5–M11 and current source I3 form a common-mode feedback circuit. If the average op amp output is higher than VCMR, more current flows through M10 and M11 into M7, which causes M5 and M6 to pull the output voltages back down. However, any mismatch between transistors M8–M11 can result in the common-mode output voltage differing from VCMR, and hence VCMR1 and VCMR2 voltages which are not equal.

Referring back to FIG. 1a, when VCMR1≠VCMR2, and the timing cycle transitions from $\phi 1$ to $\phi 2$, the voltage at the inverting input of A0 changes from approximately VCMR1 to VCMR2, which injects a transient with an amplitude about equal to VCMR1−VCMR2 into compensation capacitor CC. Similarly, a transient with an amplitude about equal to VCMR2−VCMR1 is injected into CC when the timing cycle transitions from $\phi 2$ to $\phi 1$. As shown in FIG. 1a's timing diagram, these transients appear in the ping-pong amplifier's output, which reduces the fidelity of the output signal.

SUMMARY OF THE INVENTION

A ping-pong amplifier and method are presented which overcome the problems noted above. Differences between VCMR1 and VCMR2 are reduced, which reduces switching transients that might otherwise appear in the amplifier's output.

The novel ping-pong amplifier includes an error amplifier, which has one input connected to common-mode reference voltage VCMR, its other input switchably connected to the common-mode output of one of the two differential amplifiers A1 and A2, and an output which is switchably connected to the common-mode reference voltage inputs of A1 and A2. Respective storage devices, preferably memory capacitors, are also connected to the two common-mode reference voltage inputs.

In operation, the error amplifier's input is periodically connected to the common-mode output of A1, and its output is connected to A1's common-mode reference (CMR) voltage input. This arrangement forms a closed-loop which forces A1's common-mode output voltage to be equal to VCMR; the error amplifier's output voltage is stored on the memory capacitor connected to the A1's CMR input. Similarly, the error amplifier's input and output are periodically connected to the A2's common-mode output and common-mode reference input, respectively, to force A2's common-mode output voltage to be equal to VCMR, with the error amplifier's output voltage stored on the memory capacitor connected to the A2's common-mode reference voltage input.

The voltages stored on the memory capacitors connected to the CMR inputs continuously adjust the common-mode output voltages of A1 and A2 so that VCMR1 and VCMR2 are held equal to VCMR. Keeping VCMR1=VCMR2=VCMR ensures that transients due to mismatch in the common-mode feedback circuits are largely reduced.

The invention is preferably used in an auto-zeroing configuration, which further improves the amplifier's performance.

Further features and advantages of the invention will be apparent to those skilled in the art from the following detailed description, taken together with the accompanying drawings.

DETAILED DESCRIPTION OF THE INVENTION

Figure 1A:
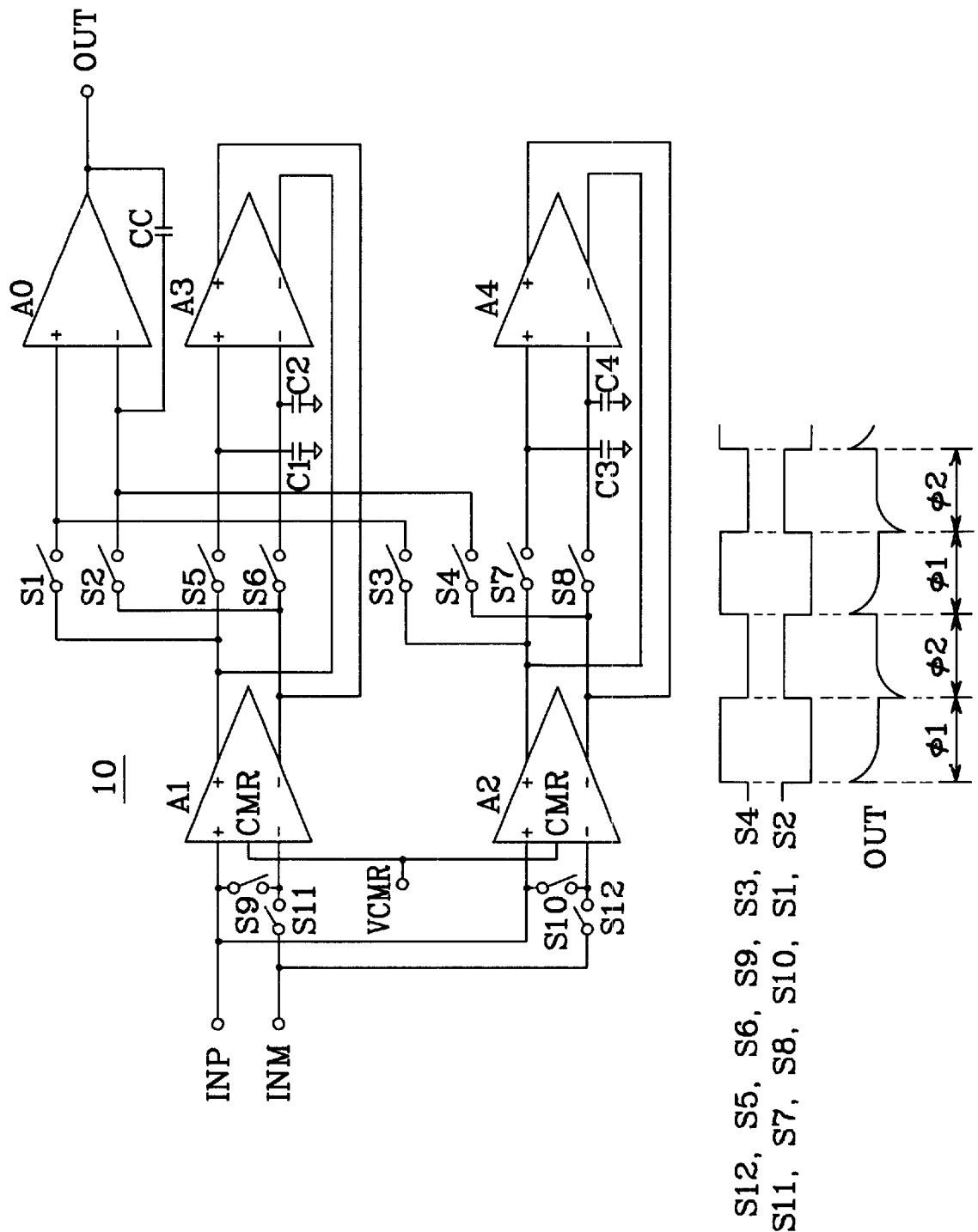
FIG. 1a is a schematic diagram and timing diagram for a prior art ping-pong amplifier.
Figure 1B:
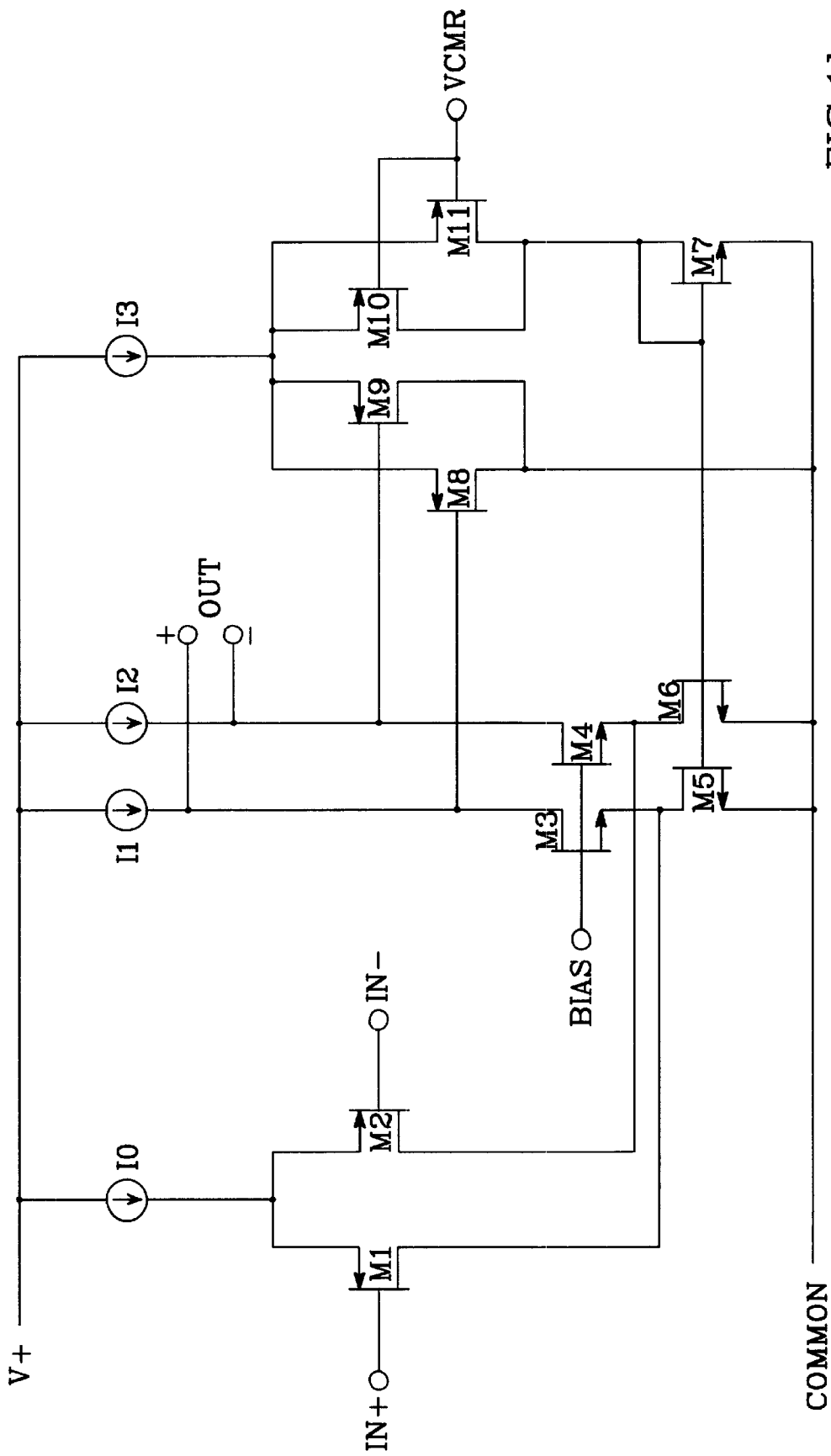
FIG. 1*b* is a schematic diagram for a known differential amplifier as might be used in the ping-pong amplifier of FIG. 1*a*.
Figure 2:
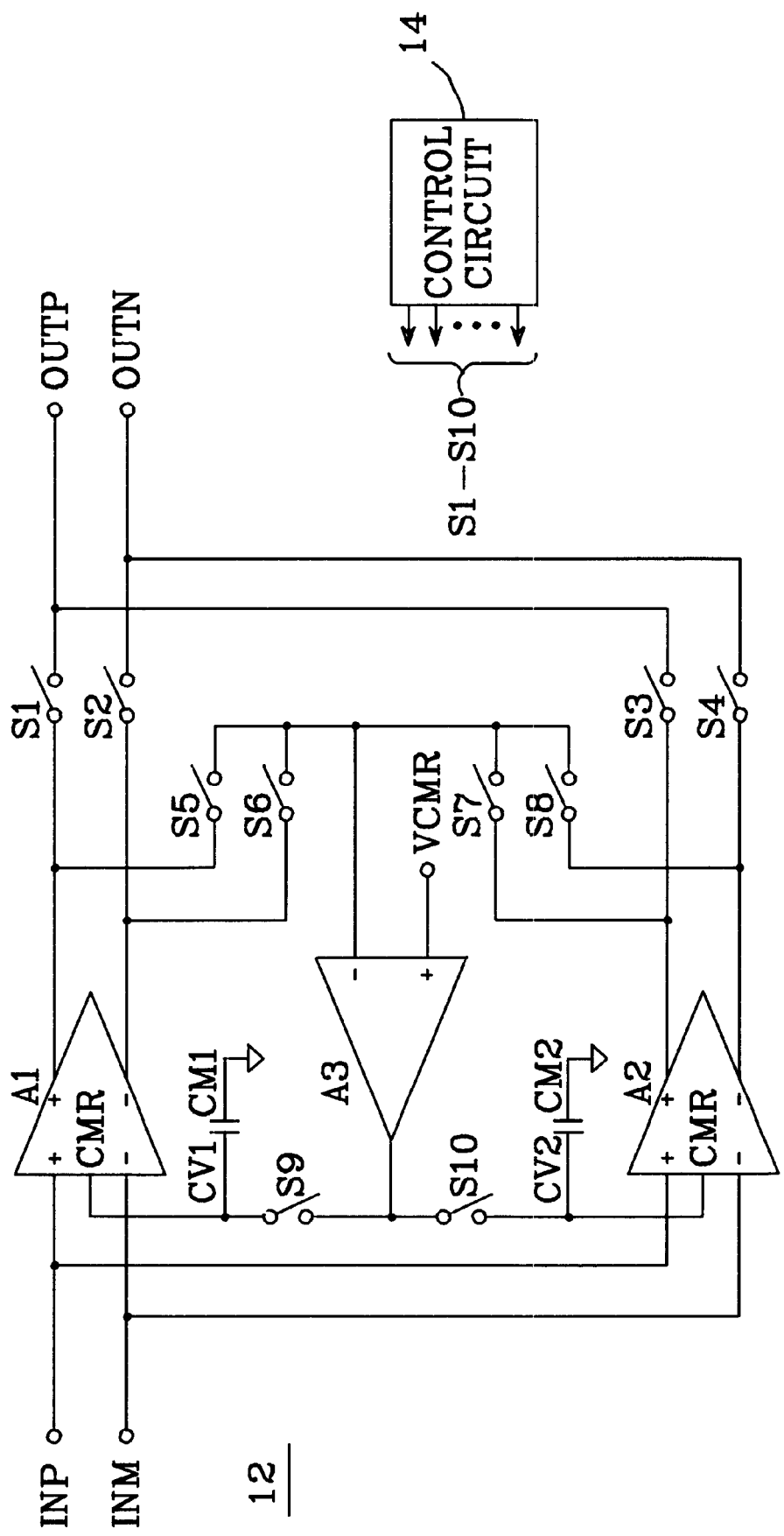
FIG. 2 is a schematic diagram of a ping-pong amplifier in accordance with the present invention.

A schematic diagram of a ping-pong amplifier 12 which illustrates the principles of the invention is shown in FIG. 2. A pair of fully differential amplifiers A1 and A2 each receive a differential input signal made up of signals INP and INM. The differential outputs of A1 are connected to a pair of switches S1 and S2, and the outputs of A2 are connected to switches S3 and S4; the outputs of switches S1 and S3 are connected together to form the ping-pong amplifier's output OUTP, and the outputs of S2 and S4 are connected together to form output OUTN. A control circuit (not shown) operates S1–S4 to alternately connect OUTP and OUTN between A1's outputs and A2's outputs.

The ping-pong amplifier also includes an error amplifier A3. One of A3's inputs is connected to a predetermined common-mode reference voltage VCMR, and A3's other input is switchably connected to the common-mode outputs of A1 and A2. A pair of switches S5 and S6 are connected between A1's outputs and A3's input such that, when closed, A1's common-mode voltage is applied to A3. Similarly, a pair of switches S7 and S8 are connected between A1's outputs and A3's input such that, when closed, A2's common-mode voltage is applied to A3.

The output of error amplifier A3 is connected to a pair of switches S9 and S10, the other sides of which are connected to the CMR inputs of A1 and A2, respectively. A pair of storage devices, preferably memory capacitors CM1 and CM2, are also connected to the CMR inputs of A1 and A2, respectively.

In operation, the common-mode output of A1 is connected to A3 via S5 and S6, and the output of A3 is connected to A1's CMR input via S9. Switches S1 and S2 are open and S3 and S4 are closed, such that A2 amplifies the differential input signal and provides the amplified signal to outputs OUTP and OUTN. When so arranged, the output of error amplifier A3 varies with the difference between the desired common-mode output voltage VCMR and A1's actual common-mode output voltage. A1, S5/S6, A3 and S9 form a closed-loop which forces A1's common-mode output voltage to be equal to VCMR. The error amplifier output voltage CV1 which brings about this result is stored on memory capacitor CM1.

Similarly, S3–S6 and S9 are opened, and S1, S2, S7, S8 and S10 are closed, so that A1 amplifies the input signal and A2's common-mode output voltage is connected to error amplifier A3. A3's output voltage CV2 forces A2's common-mode output voltage to be equal to VCMR, and is stored on memory capacitor CM2.

This procedure is repeated periodically, so that the common-mode output voltages of A1 and A2 are regularly calibrated to be equal to VCMR. As noted above, the ping-pong amplifier's output is alternately connected to the A1 and A2. By storing CV1 and CV2 on memory capacitors CM1 and CM2, respectively, the common-mode output voltages of A1 and A2 are maintained equal to VCMR while each is providing outputs OUTP and OUTN. With the common-mode output voltages of A1 (VCMR1) and A2 (VCMR2) kept equal to VCMR, transient switching errors that might otherwise appear in OUTP and OUTN are reduced.

Each of the switches shown in FIG. 2 is operated with respective control signals. Such control signals are generated with a control circuit 14 which implements the operating sequence described above. The design of such a control circuit is well-known to those acquainted with the art of timing circuits.

Figure 3A:
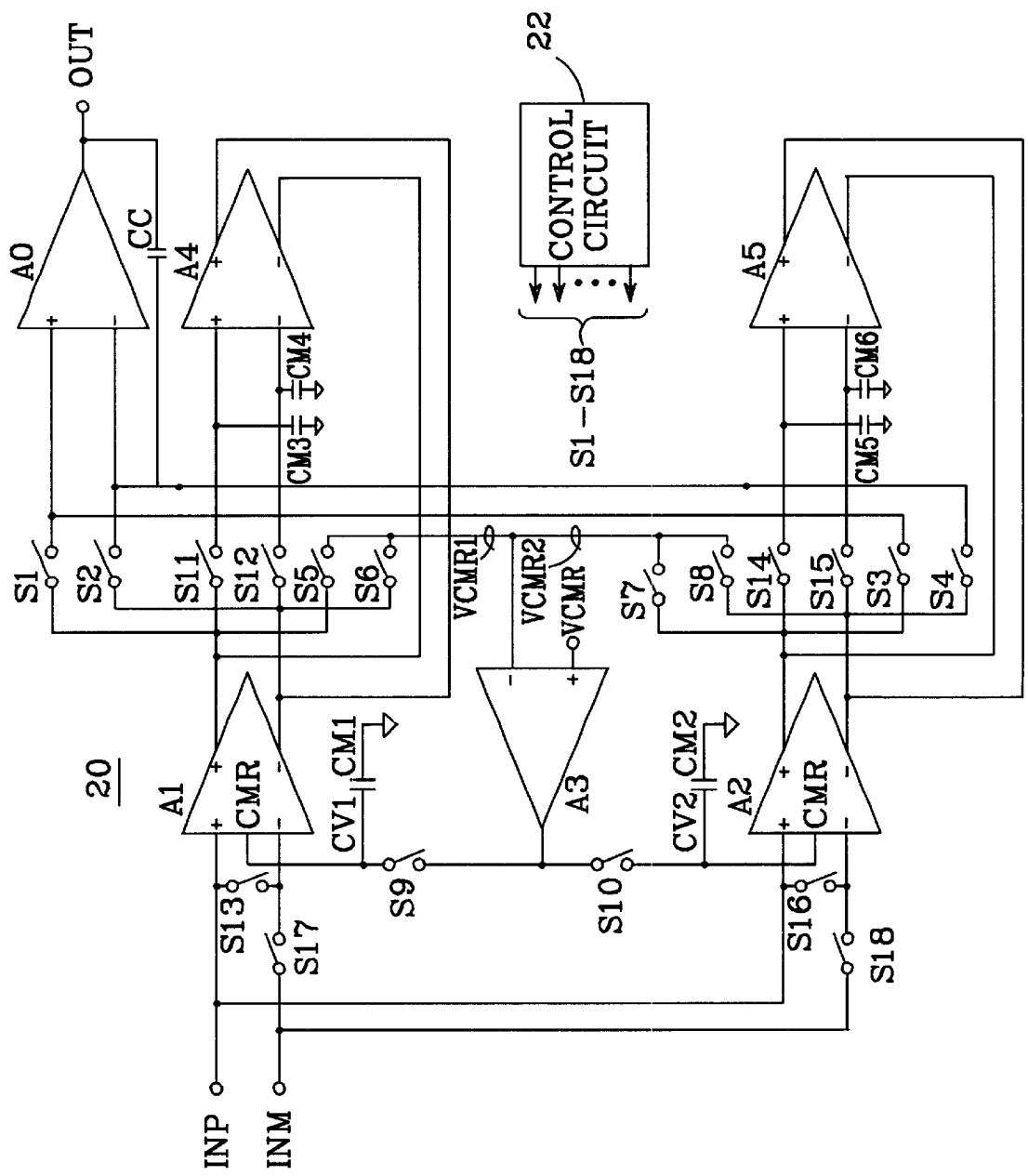
FIG. 3*a* is a schematic diagram of a preferred embodiment of an auto-zeroed ping-pong amplifier in accordance with the present invention.

FIG. 2 is intended to merely illustrate the principles of the invention; a practical ping-pong amplifier also includes auto-zeroing capability. A preferred embodiment of a ping-pong amplifier 20, which includes auto-zeroing, is shown in FIG. 3*a*. A1 is auto-zeroed using a fully differential nulling amplifier A4, the non-inverting and inverting inputs of which are connected to the corresponding outputs of amplifier A1 via a pair of switches S11 and S12. A pair of memory capacitors CM3 and CM4 are connected to A4's non-inverting and inverting inputs, respectively. To provide auto-zeroing adjustment signals to A1's outputs, A4's outputs are connected to A1's outputs in a negative feedback configuration, with the non-inverting and inverting outputs of A4 connected to A1's inverting and non-inverting outputs, respectively.

Similarly, the outputs of amplifier A2 are connected to the inputs of a fully differential nulling amplifier A5 via switches S14 and S15, with memory capacitors CM5 and CM6 connected to A5's inputs, and A5's non-inverting and inverting outputs connected to the inverting and non-inverting outputs of A2, respectively.

The ping-pong amplifier also preferably includes an output amplifier A0, which has a single-ended output OUT that provides the ping-pong amplifier's output. The differential inputs of A0 are connected to the outputs of switches S1 and S2, and to the outputs of switches S3 and S4. Output amplifier A0 typically has an associated compensation network, such as a capacitor CC which is connected between A0's output OUT and its inverting input. The differential outputs of A1 are routed to A0 when switches S1 and S2 are closed, and A2's outputs are routed to A0 when switches S3 and S4 are closed.

Figure 3B:
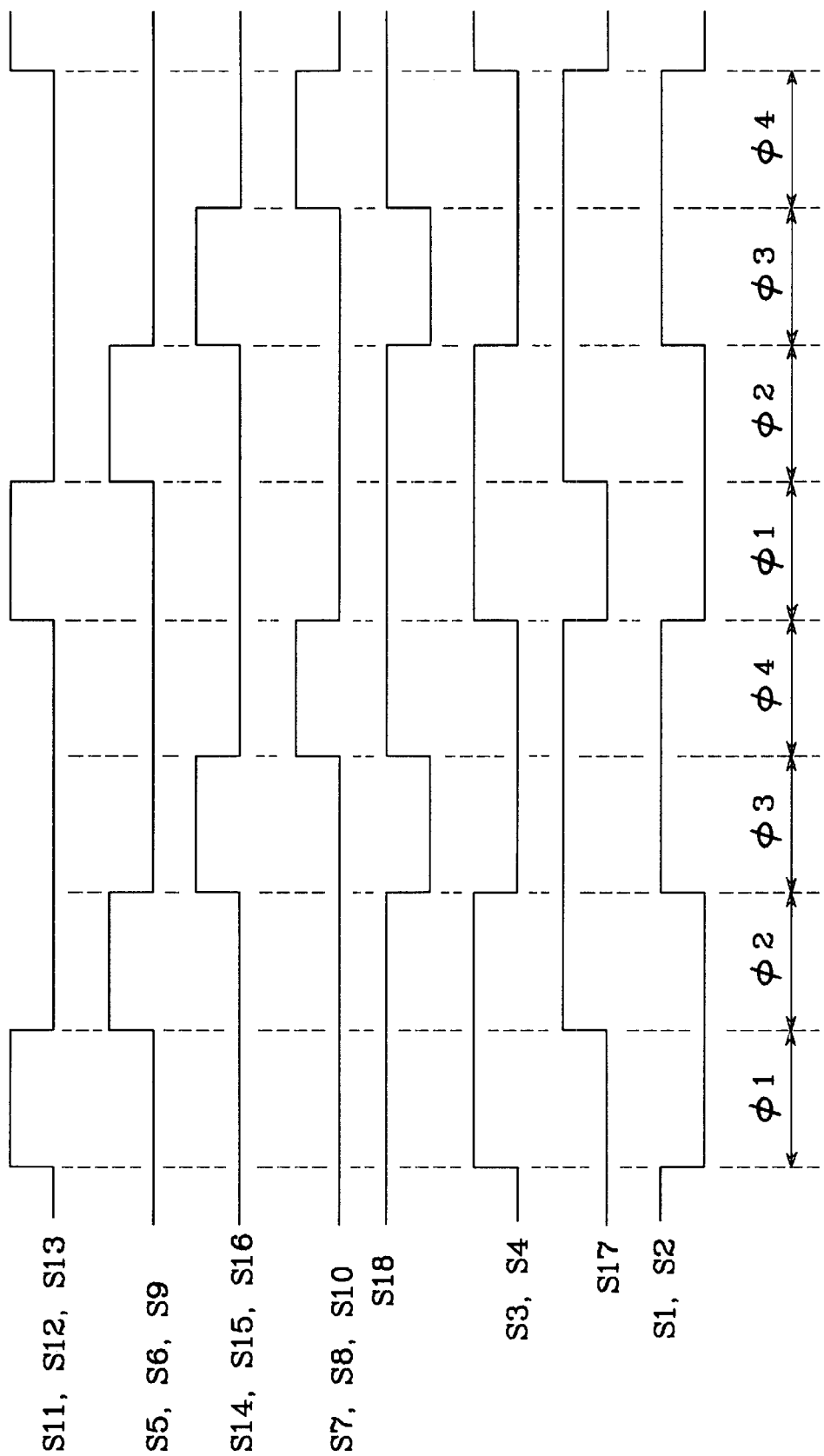
FIG. 3*b* is a timing diagram illustrating the operation of ping-pong amplifier of FIG. 3*a*.

In operation, each of the amplifiers A1 and A2 is auto-zeroed prior to having its common-mode output voltage calibrated as described above. A timing diagram illustrating the operating sequence is shown in FIG. 3*b*. A four-phase timing cycle is used. Amplifier A1 is auto-zeroed during the first phase ($\phi 1$): switches S11, S12 and S13 are closed, such that A1's inputs are connected together and its outputs are connected to the inputs of nulling amplifier A4. The resulting error signals are stored on memory capacitors CM3 and CM4. A4 receives the stored voltages and converts them to a pair of currents which serve to auto-zero A1's outputs.

During the second phase ($\phi 2$), A1's common-mode output voltage VCMR1 is calibrated as described above. Switches S5, S6 and S9 are closed, which connects VCMR1 to the input of error amplifier A3, and A3's output to A1's CMR input and to memory capacitor CM1. This forms a closed-loop which provides a voltage CV1 at A1's CMR input that forces VCMR1 to be equal to VCMR. Voltage CV1 is stored on capacitor CM1, such that VCMR1 is continuously maintained equal to VCMR.

While A1 is being auto-zeroed and having its common-mode output voltage calibrated (during $\phi 1$ and $\phi 2$, respectively), switches S3, S4 and S18 are closed, such that differential input signals INP and INM are amplified by A2 followed by output amplifier A0.

The roles are reversed during φ3 and φ4. During φ3, switches S14, S15 and S16 are closed to auto-zero A2, with the resulting error voltages stored on memory capacitors CM5 and CM6 such that auto-zeroing currents are continuously applied to A2's outputs. During φ4, switches S7, S8 and S10 are closed, which connects A2's common-mode output voltage VCMR2 to the input of error amplifier A3, and A3's output to A2's CMR input and to memory capacitor CM2. The resulting closed-loop provides a voltage CV2 at A2's CMR input which forces VCMR2 to be equal to VCMR. Voltage CV2 is stored on capacitor CM2, such that VCMR2 is held equal to VCMR.

While A2 is being auto-zeroed and having its common-mode output voltage calibrated (during φ3 and φ4, respectively), switches S1, S2 and S17 are closed, such that differential input signals INP and INM are amplified by A1 followed by output amplifier A0.

With VCMR1 and VCMR2 periodically calibrated in this way, the common-mode output voltages of both A1 and A2 are held very close to VCMR. This ensures that the voltage at A0's inverting input, and thus at compensation capacitor CC, is nearly constant. When this is the case, the magnitude of switching transients that occur due to differences between VCMR1 and VCMR2 are reduced or eliminated.

The preferred ping-pong amplifier preferably includes a switch S17 connected in series with the A1's inverting input, and a switch S18 connected in series with the A2's inverting input. Switch S17 is closed during φ2 (as well as φ3 and φ4), so that the transient at A1's inverting input is minimized when A1 is used to amplify the input signal (during φ3 and φ4). Similarly, S18 is closed during φ4 (and φ1 and φ2), so that the transient at A2's inverting input is minimized when A2 is used to amplify the input signal (during φ1 and φ2). Note that switches S17 and S18 might alternatively be positioned in series with the non-inverting inputs of A1 and A2, respectively, to minimize the transients at those inputs.

As in FIG. 2, each of the switches shown in FIG. 3a is operated with respective control signals. Such control signals are generated with a control circuit 22 which implements the timing cycle described above. The design of such a control circuit is well-known to those acquainted with the art of timing circuits.

While particular embodiments of the invention have been shown and described, numerous variations and alternate embodiments will occur to those skilled in the art. Accordingly, it is intended that the invention be limited only in terms of the appended claims.

I claim:

1. A ping-pong amplifier, comprising:
    first and second differential amplifiers, each of which have differential inputs connected to receive a differential input signal and differential outputs, a common-mode reference (CMR) voltage input, and a common-mode feedback circuit arranged to nominally set the differential amplifier's common-mode output voltage to a voltage applied to said CMR input when its differential output voltage is zero,
    a switching network,
    a control circuit which operates said switching network, said differential amplifiers, said control circuit, and said switching network arranged to form a ping-pong amplifier having an output which is alternately connected to the outputs of said first and second differential amplifiers to provide an amplified version of said differential input signal,
    an error amplifier having first and second inputs which produces an output that varies with the difference between its inputs, said first input connected to receive a predetermined common-mode reference voltage (VCMR) and said second input switchably connected to the common-mode output of one of said first and second differential amplifiers, said error amplifier output switchably connected to one of said CMR inputs,
    first and second memory capacitors connected to the CMR inputs of said first and second differential amplifiers, respectively,
    said control circuit and switching network arranged such that, periodically, the common-mode output of said first differential amplifier is connected to said error amplifier's second input and said error amplifier's output is connected to said first differential amplifier's CMR input such that a closed-loop is formed which forces said first differential amplifier's common-mode output voltage to be equal to VCMR and said error amplifier's output voltage to be stored on said first memory capacitor, and
    said control circuit and switching network further arranged such that, periodically, the common-mode output of said second differential amplifier is connected to said error amplifier's second input and said error amplifier's output is connected to said second differential amplifier's CMR input such that a closed-loop is formed which forces said second differential amplifier's common-mode output voltage to be equal to VCMR and said error amplifier's output voltage to be stored on said second memory capacitor.

2. The ping-pong amplifier of claim 1, further comprising an auto-zeroing circuit which comprises:
    first and second nulling amplifiers, each of which has inverting and non-inverting inputs and outputs, the inverting and non-inverting outputs of said first nulling amplifier connected to the non-inverting and inverting outputs, respectively, of said first differential amplifier, and the inverting and non-inverting outputs of said second nulling amplifier connected to the non-inverting and inverting outputs, respectively, of said second differential amplifier,
    third and fourth memory capacitors connected to said first nulling amplifier's inverting and non-inverting inputs, respectively, and
    fifth and sixth memory capacitors connected to said second nulling amplifier's inverting and non-inverting inputs, respectively,
    said switching network arranged to periodically connect the inverting and non-inverting outputs of said first differential amplifier to the inverting and non-inverting inputs, respectively, of said first nulling amplifier, while simultaneously connecting the inputs of said first differential amplifier together, thereby storing error signals on said third and fourth memory capacitors which auto-zero said first differential amplifier when said second differential amplifier is connected to provide an amplified version of said differential input signal, and
    said switching network arranged to periodically connect the inverting and non-inverting outputs of said second differential amplifier to the inverting and non-inverting inputs of said second nulling amplifier while simultaneously connecting the inputs of said second differential amplifier together, thereby storing error signals on said fifth and sixth memory capacitors which auto-zero said second differential amplifier when said first differential amplifier is connected to provide an amplified version of said differential input signal.

3. The ping-pong amplifier of claim 1, further comprising a single-ended output amplifier having differential inputs which are switchably connected to the differential outputs of said first differential amplifier or to the differential outputs of said second differential amplifier.

4. An auto-zeroed ping-pong amplifier, comprising:

first and second differential amplifiers, each of which have differential inputs connected to receive a differential input signal and differential outputs, a common-mode reference (CMR) voltage input, and a common-mode feedback circuit arranged to nominally set the differential amplifier's common-mode output voltage to a voltage applied to said CMR input when its differential output voltage is zero, first and second nulling amplifiers, each of which has inverting and non-inverting inputs and outputs, the inverting and non-inverting outputs of said first nulling amplifier connected to the non-inverting and inverting outputs, respectively, of said first differential amplifier, and the inverting and non-inverting outputs of said second nulling amplifier connected to the non-inverting and inverting outputs, respectively, of said second differential amplifier, first and second memory capacitors connected to said first nulling amplifier's inverting and non-inverting inputs, respectively, third and fourth memory capacitors connected to said second nulling amplifier's inverting and non-inverting inputs, respectively, an error amplifier having first and second inputs which produces an output that varies with the difference between its inputs, said first input connected to receive a predetermined common-mode reference voltage (VCMR) and said second input switchably connected to the common-mode output of one of said first and second differential amplifiers, said error amplifier output switchably connected to one of said CMR inputs, fifth and sixth memory capacitors connected to the CMR inputs of said first and second differential amplifiers, respectively, a switching network, and a control circuit which operates said switching network, said differential amplifiers, said control circuit, and said switching network arranged to form a ping-pong amplifier arranged such that said differential input signal is alternately connected to the inputs of said first and second differential amplifiers and the output of which is alternately connected to the outputs of said first and second differential amplifiers to provide an amplified version of said differential input signal, said control circuit and switching network arranged such that, periodically, the common-mode output of said first differential amplifier is connected to said error amplifier's second input and said error amplifier's output is connected to said first differential amplifier's CMR input such that a closed-loop is formed which forces said first differential amplifier's common-mode output voltage to be equal to VCMR and said error amplifier's output voltage to be stored on said fifth memory capacitor, and said control circuit and switching network further arranged such that, periodically, the common-mode output of said second differential amplifier is connected to said error amplifier's second input and said error amplifier's output is connected to said second differential amplifier's CMR input such that a closed-loop is formed which forces said second differential amplifier's common-mode output voltage to be equal to VCMR and said error amplifier's output voltage to be stored on said sixth memory capacitor.

5. The ping-pong amplifier of claim 4, wherein said switching network is arranged to periodically connect the differential outputs of said first differential amplifier to respective ones of the differential inputs of said first nulling amplifier while simultaneously connecting the inputs of said first differential amplifier together, thereby storing error signals on said first and second memory capacitors which auto-zero said first differential amplifier, and said switching network arranged to periodically connect the differential outputs of said second differential amplifier to respective ones of the differential inputs of said second nulling amplifier while simultaneously connecting the inputs of said second differential amplifier together, thereby storing error signals on said third and fourth memory capacitors which auto-zero said second differential amplifier.

6. The ping-pong amplifier of claim 4, further comprising a single-ended output amplifier having differential inputs which are switchably connected to the differential outputs of said first differential amplifier or to the differential outputs of said second differential amplifier, and an associated compensation network, said forcing of said common-mode output voltages equal to VCMR reducing switching transients which might otherwise appear on said single-ended output.

7. The ping-pong amplifier of claim 4, wherein said switching network comprises:

a first group of switches comprising:
a first switch connected between the inputs of said first differential amplifier, and
second and third switches connected between the outputs of said first differential amplifier and the inputs of said first nulling amplifier;

a second group of switches comprising:
fourth and fifth switches connected between the outputs of said first differential amplifier and said error amplifier's second input, and
a sixth switch connected between the output of said error amplifier and said first differential amplifier's CMR input;

a third group of switches comprising:
a seventh switch connected between the inputs of said second differential amplifier, and
eighth and ninth switches connected between the outputs of said second differential amplifier and the inputs of said second nulling amplifier;

a fourth group of switches comprising:
tenth and eleventh switches connected between the outputs of said second differential amplifier and said error amplifier's second input, and
a twelfth switch connected between the output of said error amplifier and said second differential amplifier's CMR input;

a fifth group of switches comprising thirteenth and fourteenth switches connected between the outputs of said second differential amplifier and said ping-pong amplifier's output; and a sixth group of switches comprising fifteenth and sixteenth switches connected between the outputs of said first differential amplifier and said ping-pong amplifier's output;

said control circuit arranged to control said switches with a four-phase timing cycle, such that:

during the first phase of said cycle, the switches of said first and fifth groups are closed and all other switches are open such that said first differential amplifier is auto-zeroed and said second differential amplifier amplifies said differential input signal and provides said amplified signal to said ping-pong amplifier's output, during the second phase of said cycle, the switches of said second and fifth groups are closed and all other switches are open such that said first differential amplifier's common-mode output voltage is forced to be equal to VCMR and said second differential amplifier amplifies said differential input signal and provides said amplified signal to said ping-pong amplifier's output, during the third phase of said cycle, the switches of said third and sixth groups are closed and all other switches are open such that said second differential amplifier is auto-zeroed and said first differential amplifier amplifies said differential input signal and provides said amplified signal to said ping-pong amplifier's output, and during the fourth phase of said cycle, the switches of said fourth and sixth groups are closed and all other switches are open such that said second differential amplifier's common-mode output voltage is forced to be equal to VCMR and said first differential amplifier amplifies said differential input signal and provides said amplified signal to said ping-pong amplifier's output.

8. The ping-pong amplifier of claim 7, further comprising a seventeenth switch connected between said differential input signal and the inverting or non-inverting input of said first differential amplifier and an eighteenth switch connected between said differential input signal and the inverting or non-inverting input of said second differential amplifier, said seventeenth switch closed during the second, third, and fourth phases of said timing cycle and said eighteenth switch closed during the first, second and fourth phases of said timing cycle.

9. A method of reducing transient switching errors in a ping-pong amplifier which comprises first and second differential amplifiers arranged in a ping-pong amplifier configuration, each of said first and second differential amplifiers having differential inputs and outputs and a common-mode reference (CMR) voltage input and arranged such that its common-mode output voltage varies with a voltage applied to its CMR input, comprising:

determining a desired common-mode output voltage (VCMR) for said first and second differential amplifiers when their respective differential output voltages are zero, periodically determining a first correction voltage which, when applied to said first differential amplifier's CMR input, forces said first differential amplifier's common-mode output voltage to be equal to VCMR, continuously applying said first correction voltage to said first differential amplifier's CMR input, periodically determining a second correction voltage which, when applied to said second differential amplifier's CMR input, forces said second differential amplifier's common-mode output voltage to be equal to VCMR, and continuously applying said second correction voltage to said second differential amplifier's CMR input.

10. The method of claim 9, wherein determining said first correction voltage comprises amplifying the difference between the common-mode output voltage of said first differential amplifier and VCMR, said amplified difference between said first differential amplifier's common-mode output voltage and VCMR being equal to said first correction voltage, and determining said second correction voltage comprises amplifying the difference between the common-mode output voltage of said second differential amplifier and VCMR, said amplified difference between said second differential amplifier's common-mode output voltage and VCMR being equal to said second correction voltage.

11. The method of claim 9, further comprising storing said first and second correction voltages in first and second storage devices connected to the CMR inputs of said first and second differential amplifiers, respectively.

12. The method of claim 9, further comprising a single-ended output amplifier having differential inputs which are switchably connected to the differential outputs of said first differential amplifier or to the differential outputs of said second differential amplifier.

13. A method of reducing transient switching errors in a ping-pong amplifier which comprises first and second differential amplifiers arranged in a ping-pong amplifier configuration, each of said first and second amplifiers having differential inputs and outputs and a common-mode reference (CMR) voltage input and arranged such that its common-mode output voltage varies with a voltage applied to its CMR input, comprising:

determining a desired common-mode output voltage (VCMR) for said first and second differential amplifiers when their respective differential output voltages are zero, providing said common-mode reference voltage VCMR, periodically amplifying the difference between the common-mode output voltage of said first differential amplifier and VCMR, said amplified difference being a first correction voltage, storing said first correction voltage in a storage device connected to said first differential amplifier's CMR input such that said first correction voltage is applied to said first differential amplifier's CMR input, periodically amplifying the difference between the common-mode output voltage of said second differential amplifier and VCMR, said amplified difference being a second correction voltage, and storing said second correction voltage in a storage device connected to said second differential amplifier's CMR input such that said second correction voltage is applied to said second differential amplifier's CMR input.

14. The method of claim 13, further comprising periodically auto-zeroing said first and second differential amplifiers.

15. The method of claim 14, further comprising:

a first nulling amplifier, the inputs of which are switchably connected to the outputs of said first differential amplifier and the outputs of which are connected to the outputs of said first differential amplifier in a negative feedback configuration, and a second nulling amplifier, the inputs of which are switchably connected to the outputs of said second differential amplifier and the outputs of which are connected to the outputs of said second differential amplifier in a negative feedback configuration.

16. The method of claim 15, wherein auto-zeroing said first and second amplifiers comprises:

periodically connecting the inputs of said first differential amplifier together and connecting the inputs of said first nulling amplifier to the outputs of said first differential amplifier, storing, while the inputs of said first differential amplifier are connected together, the voltages on the non-inverting and inverting outputs of said first differential amplifier as first and second stored voltages, respectively, applying said first and second stored voltages to the non-inverting and inverting inputs, respectively, of said first nulling amplifier, converting, with said first nulling amplifier, said first and second stored voltages to first and second currents which are provided at said first nulling amplifier's non-inverting and inverting outputs, respectively, applying said first and second currents to the inverting and non-inverting outputs, respectively, of said first differential amplifier, periodically connecting the inputs of said second differential amplifier together and connecting the inputs of said second nulling amplifier to the outputs of said second differential amplifier, storing, while the inputs of said second differential amplifier are connected together, the voltages on the non-inverting and inverting outputs of said second differential amplifier as third and fourth stored voltages, respectively, applying said third and fourth stored voltages to the non-inverting and inverting inputs, respectively, of said second nulling amplifier, converting, with said second nulling amplifier, said third and fourth stored voltages to third and fourth currents which are provided at said second nulling amplifier's non-inverting and inverting outputs, respectively, applying said third and fourth currents to the inverting and non-inverting outputs, respectively, of said second differential amplifier.

17. The method of claim 13, wherein said storage devices comprise capacitors.

18. The method of claim 13, wherein said first and second correction voltages are determined with an error amplifier.

19. The method of claim 13, further comprising a single-ended output amplifier having differential inputs which are switchably connected to the differential outputs of said first differential amplifier or to the differential outputs of said second differential amplifier.

20. A method of reducing transient switching errors in a ping-pong amplifier which comprises first and second differential amplifiers arranged in a ping-pong amplifier configuration, each of said first and second differential amplifiers having differential inputs connected to receive a differential input signal, differential outputs, and a common-mode reference (CMR) voltage input arranged such that its common-mode output voltage varies with a voltage applied to its CMR input, said ping-pong amplifier having an output which is alternately connected to the outputs of said first and second differential amplifiers to provide an amplified version of said differential input signal, comprising:

determining a desired common-mode output voltage (VCMR) for said first and second differential amplifiers when their respective differential output voltages are zero, providing said common-mode reference voltage VCMR, periodically auto-zeroing said first and second differential amplifiers, said auto-zeroing comprising:

periodically connecting the inputs of said first differential amplifier together, storing, while the inputs of said first differential amplifier are connected together, the voltages on the non-inverting and inverting outputs of said first differential amplifier as first and second stored voltages, respectively, applying said first and second stored voltages to the non-inverting and inverting inputs, respectively, of a fully differential first nulling amplifier, converting, with said first nulling amplifier, said first and second stored voltages to first and second currents which are provided at said first nulling amplifier's non-inverting and inverting outputs, respectively, applying said first and second currents to the inverting and non-inverting outputs, respectively, of said first differential amplifier, periodically connecting the inputs of said second differential amplifier together, storing, while the inputs of said second differential amplifier are connected together, the voltages on the non-inverting and inverting outputs of said second differential amplifier as third and fourth stored voltages, respectively, applying said third and fourth stored voltages to the non-inverting and inverting outputs, respectively, of a fully differential second nulling amplifier, converting, with said second nulling amplifier, said third and fourth stored voltages to third and fourth currents which are provided at said second nulling amplifier's non-inverting and inverting outputs, respectively, applying said third and fourth currents to the inverting and non-inverting outputs, respectively, of said second differential amplifier, periodically amplifying the difference between the common-mode output voltage of said first differential amplifier and VCMR, said amplified difference being a first correction voltage, storing said first correction voltage in a storage device connected to said first differential amplifier's CMR input such that said first correction voltage is applied to said first differential amplifier's CMR input, periodically amplifying the difference between the common-mode output voltage of said second differential amplifier and VCMR, said amplified difference being a second correction voltage, and storing said second correction voltage in a storage device connected to said second differential amplifier's CMR input such that said second correction voltage is applied to said second amplifier's CMR input.

21. The method of claim 20, wherein said ping-pong amplifier is operated using a four-phase timing cycle, such that:

during the first phase of said timing cycle, said first differential amplifier is auto-zeroed and said second differential amplifier amplifies said differential input signal and provides said amplified signal to said ping-pong amplifier's output, during the second phase of said timing cycle, said first correction voltage is generated and stored and said second differential amplifier amplifies said differential input signal and provides said amplified signal to said ping-pong amplifier's output, during the third phase of said timing cycle, said second differential amplifier is auto-zeroed and said first differential amplifier amplifies said differential input signal and provides said amplified signal to said ping-pong amplifier's output, and during the fourth phase of said timing cycle, said second correction voltage is generated and stored and said first differential amplifier amplifies said differential input signal and provides said amplified signal to said ping-pong amplifier's output.

22. The method of claim 20, further comprising a single-ended output amplifier having differential inputs which are switchably connected to the differential outputs of said first differential amplifier or to the differential outputs of said second differential amplifier.

* * * * *